(12) United States Patent
Nakajima et al.

(10) Patent No.: US 10,486,916 B2
(45) Date of Patent: Nov. 26, 2019

(54) ARTICLE SUPPLYING DEVICE

(71) Applicant: KURASHIKI BOSEKI KABUSHIKI KAISHA, Okayama (JP)

(72) Inventors: Daisuke Nakajima, Osaka (JP); Hideaki Hikawa, Osaka (JP)

(73) Assignee: KURASHIKI BOSEKI KABUSHIKI KAISHA, Okayama (JP)

( * ) Notice: Subject to any disclaimer, the term of this patent is extended or adjusted under 35 U.S.C. 154(b) by 0 days.

(21) Appl. No.: 16/088,834

(22) PCT Filed: Mar. 9, 2017

(86) PCT No.: PCT/JP2017/009535
§ 371 (c)(1),
(2) Date: Sep. 27, 2018

(87) PCT Pub. No.: WO2017/169636
PCT Pub. Date: Oct. 5, 2017

(65) Prior Publication Data
US 2019/0112135 A1 Apr. 18, 2019

(30) Foreign Application Priority Data

Mar. 31, 2016 (JP) ................................. 2016-069996

(51) Int. Cl.
*B65G 47/82* (2006.01)
*B65G 47/08* (2006.01)
(Continued)

(52) U.S. Cl.
CPC ............. *B65G 47/82* (2013.01); *B65G 47/08* (2013.01); *B65G 47/88* (2013.01); *B65G 47/8815* (2013.01); *H05K 13/02* (2013.01)

(58) Field of Classification Search
CPC ........................... B65G 47/82; B65G 47/8815
(Continued)

(56) References Cited

U.S. PATENT DOCUMENTS 3,548,998 A * 12/1970 Heller .................... H05K 13/02
198/468.9
4,896,792 A * 1/1990 Marchand ............... G07F 11/10
221/103
(Continued)

FOREIGN PATENT DOCUMENTS

| CN | 1476071 | 2/2004 |
|---|---|---|
| JP | S54155578 | 12/1979 |

(Continued)

OTHER PUBLICATIONS

"International Search Report (Form PCT/ISA/210)", dated Jun. 13, 2017, with English translation thereof, pp. 1-4.

*Primary Examiner* — Douglas A Hess
(74) *Attorney, Agent, or Firm* — JCIPRNET

(57) ABSTRACT

An article supplying device is provided. The article supplying device has a conveyance portion for conveying conveyed objects, and a movable block. The movable block includes a housing portion capable of housing one conveyed object at a receiving position in which the housing portion communicates with a downstream end of the conveyance portion. The movable block is capable of a reciprocal movement in a direction intersecting a receiving direction of the conveyed objects. Moreover, the movable block includes a biting preventing portion for pushing back a subsequent conveyed object entered into the housing portion after the conveyed object having been housed in the housing portion toward the conveyance portion.

6 Claims, 9 Drawing Sheets

(51) Int. Cl.
*B65G 47/88* (2006.01)
*H05K 13/02* (2006.01)

(58) Field of Classification Search
USPC .............. 198/368, 463.4, 468.9, 468.11;
414/794.7, 753.1
See application file for complete search history.

(56) References Cited

U.S. PATENT DOCUMENTS

| | | | | |
|---|---|---|---|---|
| 5,073,342 | A * | 12/1991 | Porte | G01N 35/00029 |
| | | | | 198/468.11 |
| 5,152,390 | A * | 10/1992 | Kubota | B65G 47/848 |
| | | | | 198/463.4 |
| 5,542,524 | A * | 8/1996 | Sakoda | B23P 19/003 |
| | | | | 198/409 |
| 5,950,801 | A | 9/1999 | Vroomans | |
| 6,253,902 | B1 * | 7/2001 | Saito | H05K 13/028 |
| | | | | 198/396 |
| 6,257,384 | B1 * | 7/2001 | Sato | F16D 41/10 |
| | | | | 192/37 |
| 6,497,319 | B2 * | 12/2002 | Atsumi | B65G 29/00 |
| | | | | 198/459.6 |
| 6,752,291 | B2 * | 6/2004 | Saito | H05K 13/021 |
| | | | | 221/164 |
| 7,837,027 | B2 * | 11/2010 | Takeuchi | H01L 21/67784 |
| | | | | 198/493 |
| 9,051,133 | B2 * | 6/2015 | Kremser | B65G 51/02 |
| 10,087,016 | B2 * | 10/2018 | Nakajima | B65G 47/14 |
| 2011/0005895 | A1 | 1/2011 | Kim et al. | |

FOREIGN PATENT DOCUMENTS

| | | |
|---|---|---|
| JP | S61291317 | 12/1986 |
| JP | H02120423 U | 9/1990 |
| JP | H06115669 | 4/1994 |
| JP | H10294597 | 11/1998 |
| JP | 2002190694 | 7/2002 |
| JP | 2013001541 | 1/2013 |
| SG | 113471 | 8/2005 |
| TW | 201527191 | 7/2015 |

* cited by examiner

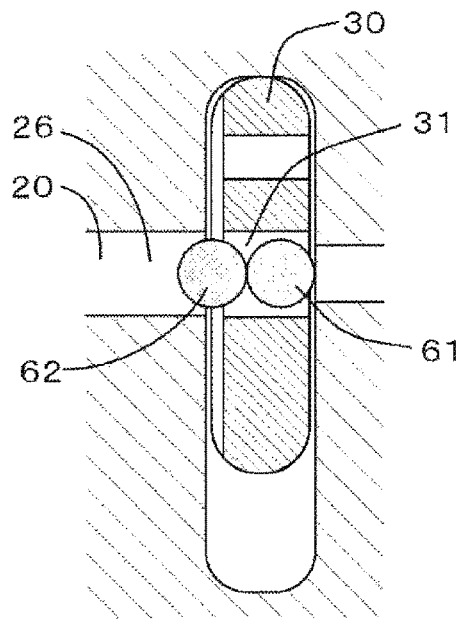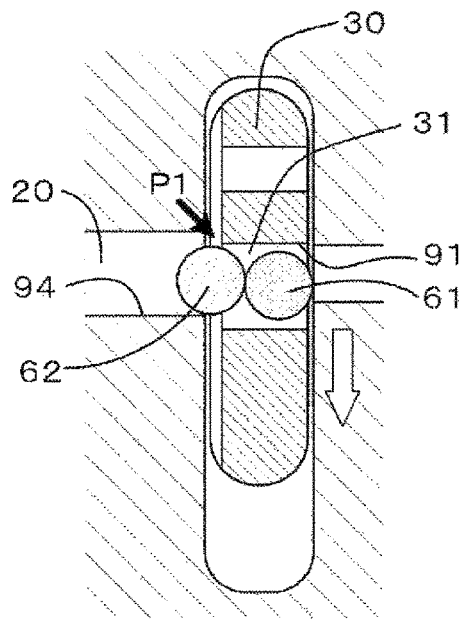
FIG. 9A    FIG. 9B
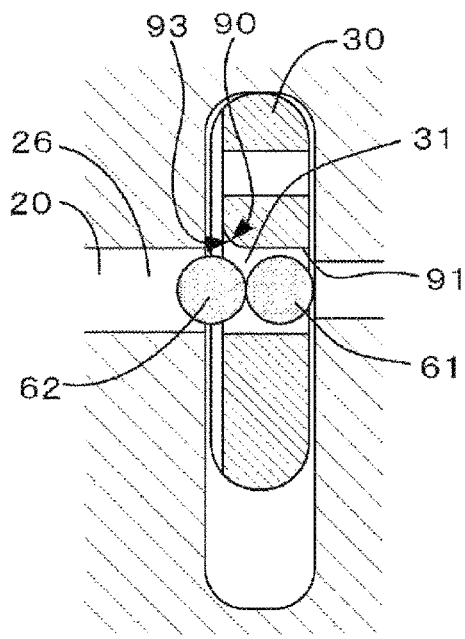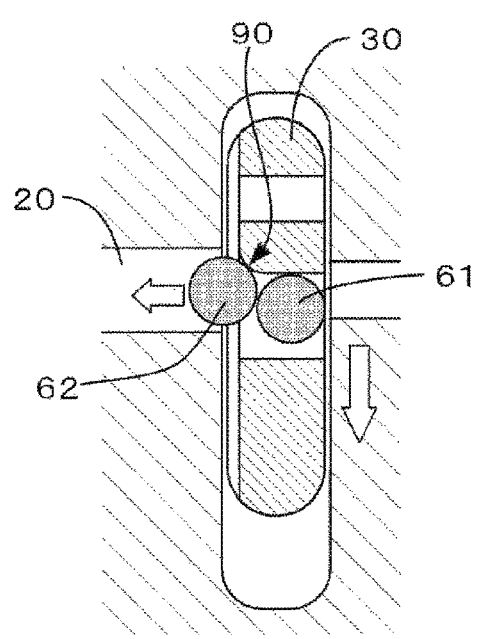
FIG. 10A    FIG. 10B

ARTICLE SUPPLYING DEVICE

CROSS-REFERENCE TO RELATED APPLICATION

This application is a 371 application of the international PCT application serial no. PCT/JP2017/009535, filed on Mar. 9, 2017, which claims the priority benefit of Japan application no. 2016-069996, filed on Mar. 31, 2016. The entirety of each of the above-mentioned patent applications is hereby incorporated by reference herein and made a part of this specification.

TECHNICAL FIELD

The present invention relates to a device that conveys and supplies minute articles.

BACKGROUND ART

A tape-reel feeder has been used to supply electronic components to be mounted on a print substrate. The tape-reel feeder is a device that forms dimples on a tape made of synthetic resin or paper at intervals of 1 to 2 mm, houses electronic components in the dimples, and supplies the electronic components to a mounting device (mounter). However, the tape-reel feeder has problems in that its size becomes large due to bulkiness of the tape, and the tape become a waste product after its usage.

To address this problem, a bulk feeder has been developed that uses no tape. In the bulk feeder, electronic components are thrown in a hopper, introduced in a conveyance path having a tunnel shape from a lower portion of the hopper, aligned in line, and conveyed and supplied to a mounter by an air flow. The electronic components that have reached a take-out port provided at a conveyance path end are sucked by a pickup nozzle of the mounter to be sequentially taken out. For example, Patent Literature 1 describes a bulk feeder that sends rectangular chips randomly housed in a cassette into a tunnel and conveys the chips by vacuum suction from an end side (downstream side) of the tunnel.

A solder ball is used to electrically connect an electronic component such as a ball grid array (BGA) semiconductor package and a printed circuit board. To align solder balls, an array board has been conventionally used in which a number of holes each for housing one solder ball are arranged. For example, solder balls can be aligned by dropping a number of solder balls on the array board and rubbing on the array board with a squeegee made of a rubber to make solder balls enter the holes and remove the redundant solder balls.

In doing so, in the conventional method using the array board, a solder ball can be nipped between the squeegee and an edge of the hole, causing chipping or cracking. In this case, electrical conduction properties are disadvantageously changed due to reduction of the volume of the solder ball. To address this problem, too, solder balls may be supplied one by one using a bulk feeder or the like.

CITATION LIST

Patent Literature

Patent Literature 1: JP-A-H10-294597

SUMMARY OF INVENTION

Technical Problem

However, studies by the present inventors have revealed that the conventional bulk feeder has a problem in improving supply speed. Reducing a take-out time interval (pitch) by the pickup nozzle increases the probability of failure in taking out the conveyed object. The reason of the problem is not in slow speed of the conveyance itself but in the interference of the subsequent conveyed object with the conveyed object to be taken out from a downstream end of the conveyance path. That is, the studies have shown that the conveyed objects aligned and conveyed in the conveyance path reach the downstream end one after another to form a line without gaps, causing the leading one conveyed object to be caught by the subsequent conveyed object to interrupt taking out the leading one conveyed object.

The present invention has been made in consideration of the above problems, and an object thereof is to provide an article supplying device capable of conveying minute articles and supplying the conveyed minute articles at a high speed. In more detail, an object is to provide an article supplying device which can stably supply minute articles even with large variation in size.

Solution to Problem

To achieve the above object, an article supplying device of the present invention separates only a leading conveyed object at a downstream end of a conveyance path and the like, and moves the leading conveyed object in a side direction.

An article supplying device of the present invention has a conveyance portion for conveying conveyed objects, and a movable block. The movable block includes a housing portion capable of housing one of the conveyed objects at a receiving position in which the housing portion communicates with a downstream end of the conveyance portion. Moreover, the movable block is capable of a reciprocal movement in a direction intersecting a receiving direction of the conveyed objects, and the housing portion is in the receiving position at one end of the reciprocal movement, and the housing portion is at a dispensing position or a take-out position in which the conveyed objects can be dispensed or taken out at an other end of the reciprocal movement. Moreover, the movable block includes a biting preventing portion for pushing back a subsequent conveyed object of the conveyed objects entered into the housing portion after a previous conveyed object of the conveyed objects having been housed in the housing portion toward the conveyance portion.

The biting preventing portion may contacts the subsequent conveyed object along with movement of the reciprocal movement from the one end to the other end to push back the sequent conveyed object to the conveyed portion.

Preferably, the biting preventing portion is a chamfered portion provided at a corner on a conveyance portion side of a side wall located on a receiving position side of the housing portion.

More preferably, the chamfered shape is a cutaway plane.
More preferably, the chamfered shape is a fillet surface.
The article supplying device further has pressurization/depressurization portions at each end of a movable area of the movable block, and the movable block may be capable of the reciprocal movement by a pressure difference caused by the pressurization/depressurization portions.

In the article supplying device, the movable block further has a positioning mechanism, and the positioning mechanism may position the conveyed object having been housed in the housing portion within the housing portion.

Advantageous Effects of Invention

The article supplying device of the present invention makes it possible to separate, at a high speed by the movable block, only the leading one conveyed object from a line of the conveyed objects that have reached the downstream end of the conveyance portion. The conveyed object separated in this manner can be taken out by a pickup nozzle without interference with the subsequent conveyed object or introduced to another conveyance path with synchronization. Here, if a size of the conveyed object is smaller than the reference, a part of the subsequent conveyed object could enter into the housing portion in some cases. At this time, such a problem could occur that the subsequent conveyed object is bitten between the movable block and an end of the conveyance portion, whereby the reciprocal movement of the movable block is stopped. However, according to the article supplying device of the present invention, this biting can be prevented by pushing back the subsequent conveyed object entered into the housing portion toward the conveyance portion.

BRIEF DESCRIPTION OF DRAWINGS

FIGS. 9A and 9B are diagrams for explaining a case where biting occurs in the movable block.

FIGS. 10A and 10B are diagrams for explaining an operation of a biting preventing portion of the article supplying device which is the first embodiment of the present invention.

DESCRIPTION OF EMBODIMENTS

An article supplying device according to a first embodiment of the present invention will be described with reference to FIG. 1 to FIGS. 9A and 9B. Note that in each diagram, its reduction scale is incorrect and a gap between members and the like are exaggerated for easy description.

Figure 1:
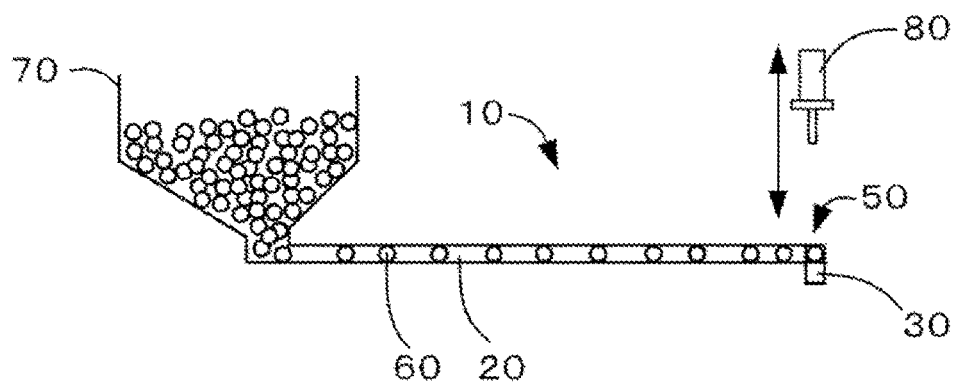
FIG. 1 is a side view illustrating a usage state of an article supplying device according to a first embodiment of the present invention.
Figure 2:
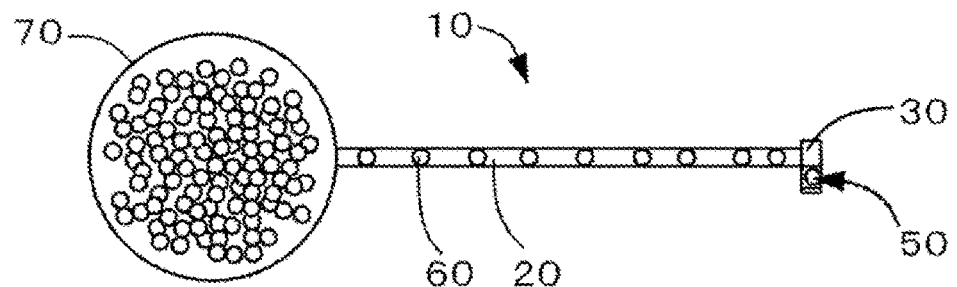
FIG. 2 is a plan view illustrating the usage state of the article supplying device according to the first embodiment of the present invention.

In FIG. 1 and FIG. 2, an article supplying device 10 of the embodiment is combined with a hopper 70 to convey and supply solder balls 60 that are conveyed objects. The solder balls are thrown into the hopper and led from a lower portion of the hopper to a first conveyance path 20 that is a conveyance portion of the supplying device. In this embodiments, the "first conveyance path" is simply referred to as the "conveyance path". The solder balls are aligned in line and conveyed to the downstream in the conveyance path by an air flow. The solder balls are moved to a take-out port 50 provided on the lateral side of a downstream end of the conveyance path by a movable block 30 provided at the downstream end of the conveyance path, and sucked by a pickup nozzle 80 to be taken out.

The solder balls 60 that are conveyed objects have a spherical shape. The size of the conveyed objects is not specifically limited. However, when the conveyed objects are large, influence of interference between the conveyed objects becomes relatively small, reducing the significance of using the supply device of the embodiment. Therefore, for the size of the conveyed objects, the diameters are preferably not more than 5 mm, more preferably not more than 2 mm, and particularly preferably less than 1 mm. In contrast, when the conveyed objects are too small, processing and manufacturing of the device become difficult. Therefore, for the size of the conveyed objects, the diameters are preferably not less than 10 μm. For the diameters of the solder balls, the solder balls of 100 μm to 800 μm are often used. The article supplying device of this embodiment is especially suitable to convey and supply solder balls of these dimensions.

Figure 3:
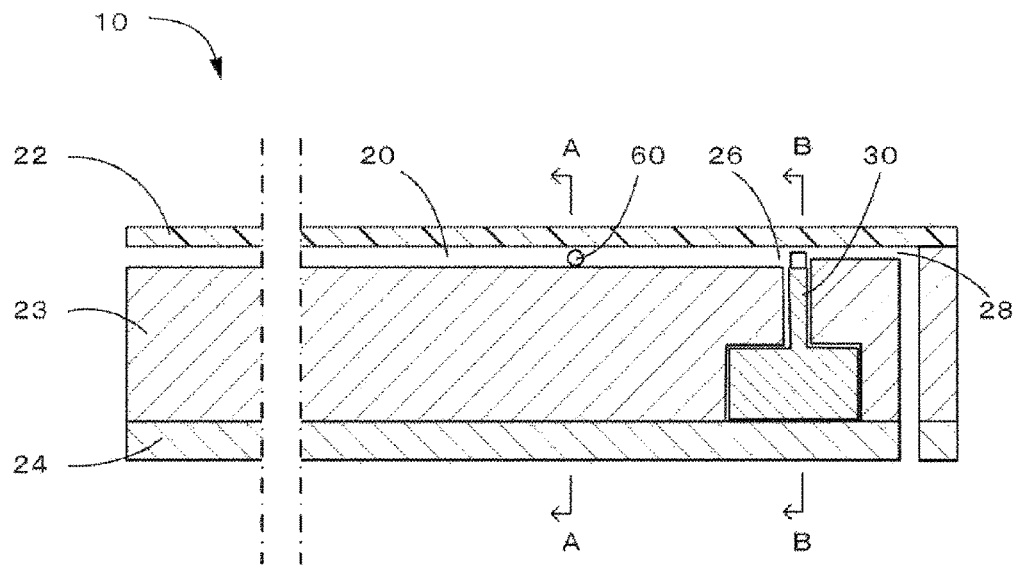
FIG. 3 is a vertical cross-sectional view along a first conveyance path of the article supplying device according to the first embodiment of the present invention.
Figure 4:
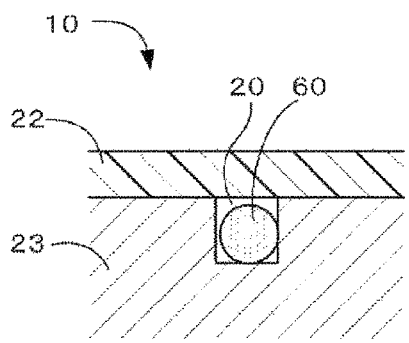
FIG. 4 is a diagram illustrating A-A cross section of FIG. 3.

In FIG. 3 and FIG. 4, the conveyance path 20 that is a conveyance path of this embodiment is formed in a tunnel shape by a groove formed in a base member 23 and a cover member 22 covering the upper face of the groove. The cross sectional shape of the tunnel may be circular, or rectangular as shown in FIG. 4. The size of the cross section of the tunnel is slightly larger than that of the solder ball 60. To convey minute components at a high speed, it is preferable to form a conveyance path of a closed system in which its side faces and upper and lower faces are regulated in this manner.

Air supply portions (27 in FIG. 6) and an air suction portion 28 are respectively provided at the upstream and the downstream of the conveyance path 20. The air suction portion 28 is formed to communicate with the conveyance path 20, and not to allow the passage of the solder balls 60. The air supply portions supply air into the conveyance path. The air suction portion sucks the air in the conveyance path. The air suction portion 28 of the embodiment sucks the air in the conveyance path from a downstream end 26 of the conveyance path. The air supply portions and the air suction portion make it possible to generate an air flow that flows from the upstream to the downstream in the conveyance path. Note that, in order to generate the air flow, it suffices to form either the air supply portions at the conveyance path upstream or the air suction portion at the conveyance path downstream, and in this case, a vent portion may be provided instead of the other one. When the conveyance path is long, an air suction portion and an air supply portion may be appropriately added in midstream of the conveyance path.

Figure 5:
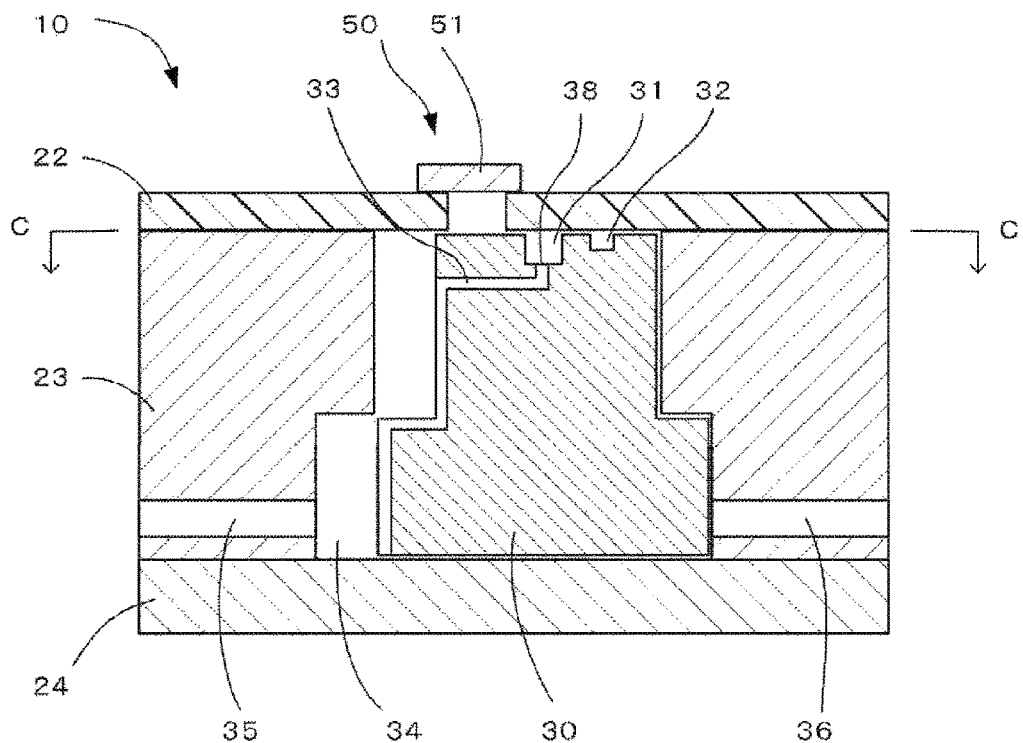
FIG. 5 is a diagram illustrating B-B cross section of FIG. 3.
Figure 6:
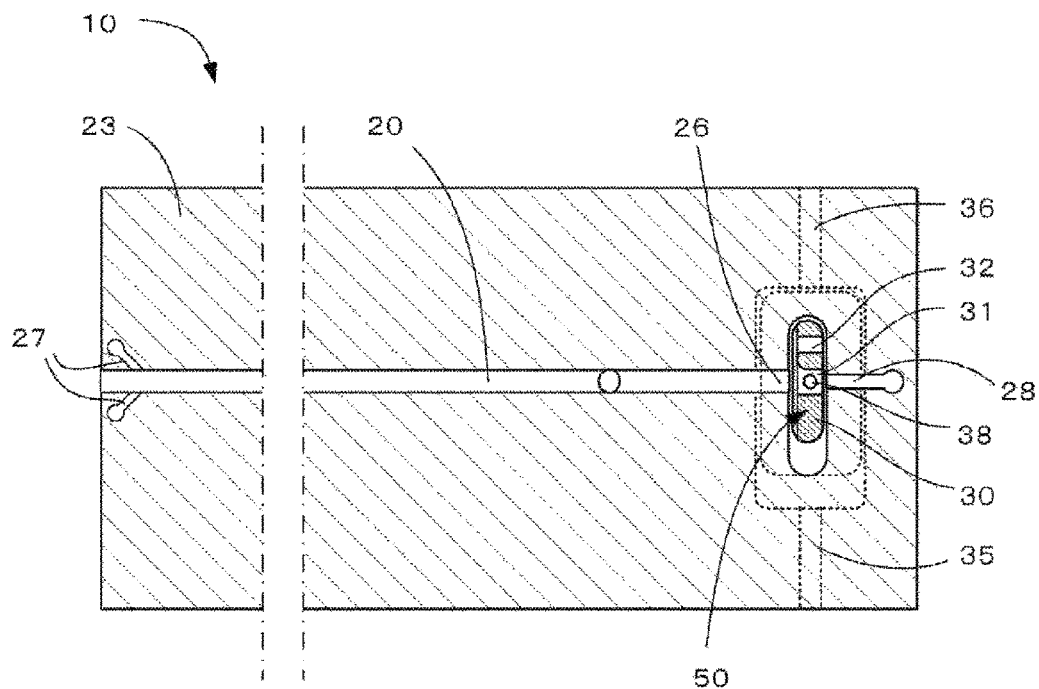
FIG. 6 is a diagram illustrating C-C cross section of FIG. 5.

In FIG. 5 and FIG. 6, the movable block 30 is disposed at the downstream end 26 of the conveyance path 20. The movable block is movable in the direction perpendicular to the conveyance path in a horizontal plane (left-right direction in FIG. 5, upper-lower direction in FIG. 6), and reciprocally movable along a straight line between the downstream end of the conveyance path and the take-out port 50 provided on the lateral side of the downstream end of the conveyance path. The cover member 22 has an opening above the take-out port, and an openable and closable shatter 51 is provided at the opening. A movable area 34 of the movable block 30 is defined by a hollow space formed by the base member 23 and a bottom member 24. Pressurization/depressurization portions 35, 36 are provided at respective each end of the movable area 34. Note that the shatter 51 is not essential, and the take-out port may be always opened.

In this manner, it is preferable that the movable block 30 be reciprocated in a horizontal plane. This is because the movable block can be reciprocated with a smaller driving force. Furthermore, it is preferable that the movable block be reciprocated in the direction perpendicular to the conveyance path, that is, in the direction perpendicular to the receiving direction of the conveyed objects. This is because the length of the housing portion can be made short to make the movable block smaller with respect to the conveyed objects having the same size.

Figure 13:
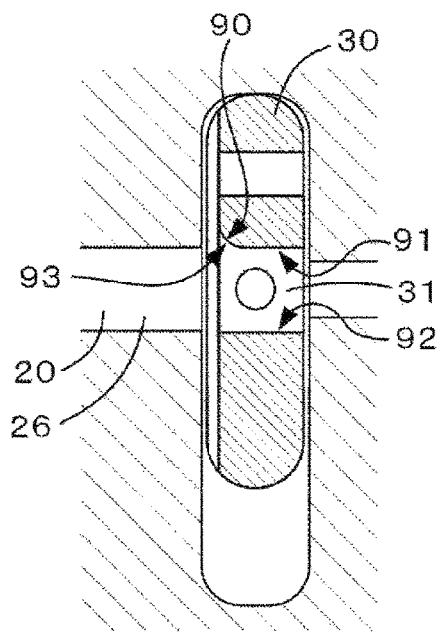
FIG. 13 is an enlarged plan view of the movable block of the article supplying device which is the first embodiment of the present invention.

The movable block 30 has, at an upper face, a housing portion 31 having a groove shape capable of housing one solder ball. As illustrated in FIG. 13, the housing portion 31 is formed between two side walls 91, 92 formed side by side in a moving direction of the movable block 30. A corner 93 on the conveyance path 20 side (conveyance path downstream end 26 side) of the side wall 91 located on a receiving position side of the housing portion is chamfered into a fillet surface shape and forms a biting preventing portion 90. Here, chamfering of the corner into the fillet surface means that the corner is rounded. The shape of the roundness is not particularly limited, and the chamfered portion of the corner may be a part of a side face of a column or may be a part of the side face of an elliptic cylinder, for example.

Returning to FIG. 5 and FIG. 6, the housing portion 31 is a housing portion of a closed system in which its both side faces and its upper and lower faces are regulated, making it possible to stably move the solder ball while preventing the solder ball in the housing portion from jumping out of the housing portion even when the movable block is driven at a high speed in the state where the solder ball 60 is housed in the housing portion 31. When the movable block is at one end in the reciprocal movement (right side in FIG. 5, upper side in FIG. 6), the housing portion serves as an extension of the conveyance path 20, making it possible to receive one solder ball that has reached the downstream end 26 of the conveyance path. Hereinafter, this state is called that the movable block or the housing portion is in a receiving position.

When the movable block 30 is at the other end of the reciprocal movement (left side in FIG. 5, lower side in FIG. 6), the solder ball housed in the housing portion 31 is located at the take-out port 50, so that opening the shatter 51 on the upper portion makes it possible to take-out the solder ball by a pickup nozzle. This state is called that the movable block or the housing portion is in a take-out position.

A vent portion 32 for conveyance is formed in the movable block 30 on the side opposite to the take-out port 50 with respect to the housing portion 31 at the upper face. The vent portion for conveyance only needs to have the shape that makes the downstream end 26 of the conveyance path communicate with the air suction portion 28 when the movable block is in the take-out position and that enables the solder balls that have reached the downstream end 26 of the conveyance path to be dammed.

The movable block 30 has a vent portion 33 for fixation as a mechanism for positioning the solder ball, and an opening 38 having a round shape of the vent portion for fixation is provided on the bottom face of the housing portion 31. The vent portion for fixation is communicated with a pressurization/depressurization portion 35 on the take-out port side. This enables to fix the conveyed object to the opening 38 by depressurizing the inside of the vent portion 33 for fixation. The vent portion 33 for fixation may have a radius that becomes smaller as it goes downward from the opening 38, that is, as it goes inward. For example, an inner wall surface of the vent for fixation may be formed in a mortar shape in which the radius of the vent portion for fixation becomes smaller as it goes downward from the opening 38. Making the opening have a mortar shape or the like in this manner makes a solder ball received in the housing portion be drawn to the opening to be fixed to the opening within a shorter period of time.

Figure 7A:
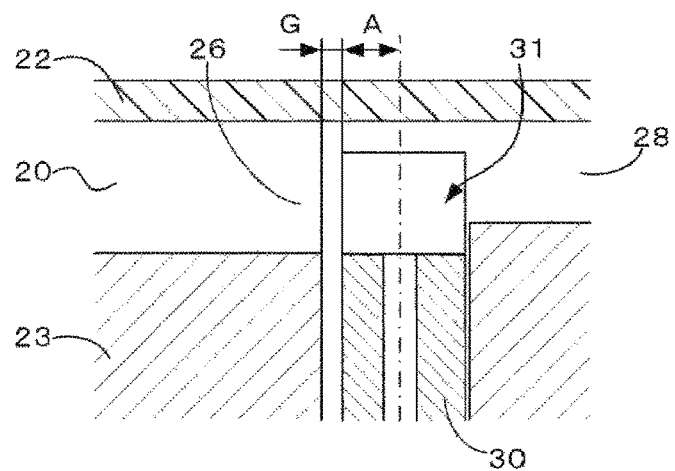
FIGS. 7A to 7C are enlarged views illustrating a housing portion of a movable block of the article supplying device according to the first embodiment of the present invention.
Figure 7B:
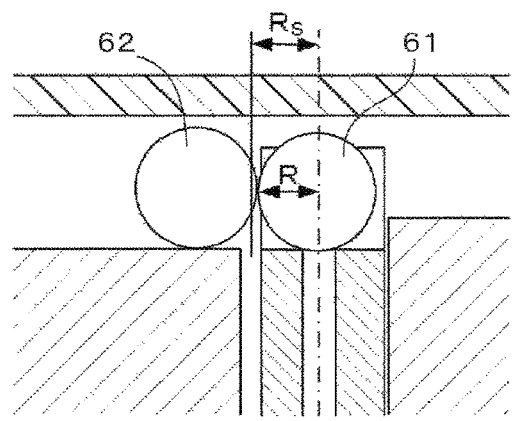
Figure 7C:
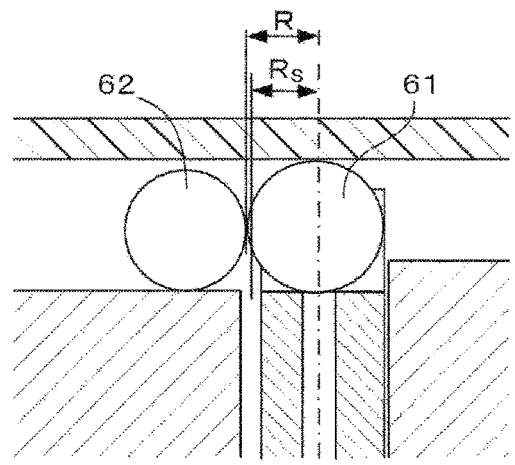

FIGS. 7A to 7C illustrate an enlarged vicinity of the housing portion 31 of the movable block 30. In FIG. 7A, when the movable block is in the receiving position, the housing portion 31 communicates with the conveyance path 20 to be an extension of the conveyance path, making it possible to receive one solder ball.

The relationship between a distance A from the center of the opening to the end on the conveyance path side of the housing portion and a standard radius $R_S$ of the solder ball normally is $A \leq R_S$. Note that when the distance A equals the standard radius $R_S$ of the solder ball, in the case where a solder ball smaller than that is mixed, an leading end of the subsequent solder ball enters the housing portion and interferes with the movement of the movable block to the take-out position. Therefore, it is preferable that the above distance A be shorter than the standard radius $R_S$. Referring to FIG. 7B, this prevents a leading end of the subsequent solder ball 62 from entering the housing portion even when the radius R of the solder ball 61 housed in the housing portion is smaller than standard radius $R_S$, thus preventing the movement of the movable block from being interrupted. Specifically, it is preferable that the distance A be not more than $R_S \times 0.99$, and more preferably not more than $R_S \times 0.95$. In contrast, when the distance A is too short, the housed solder ball becomes instable, it is therefore preferable that the distance A be not less than $R_S \times 0.6$, and more preferably not less than $R_S \times 0.7$.

Moreover, a gap G is provided between the housing portion 31 and the downstream end 26 of the conveyance path. It is preferable that the sum A+G of the above distance A and gap G be longer than the standard radius $R_S$ of the solder ball. Referencing to FIG. 7C, this prevents the solder ball 61 from being caught at the downstream end of the conveyance path when the movable block is moved to the take-out position even when the radius R of the solder ball 61 housed in the housing portion is larger than the standard radius $R_S$. Specifically, it is preferable that the sum A+G of the distance A and the gap G be not less than $R_S \times 1.01$, and more preferably not less than $R_S \times 1.05$. In contrast, when the gap G is too large, the solder ball can be caught at the gap when the solder ball moves from the conveyance path to the housing portion, it is therefore preferable that the gap G be not more than $R_S \times 0.3$, and more preferably not more than $R_S \times 0.2$. For example, in the case where $G \leq R_S \times 0.3$, when $A = R_S \times 0.8$, $A+G \leq R_S \times 1.1$ is satisfied, and when $A = R_S \times 0.9$, $A+G \leq R_S \times 1.2$ is satisfied. In actual sizes, for example, when the standard radius $R_S = 400$ μm, A=360 μm and G=120 μm, so that A+G=480 μm.

Next, operation of the movable block of the embodiment will be described.

Figure 8A:
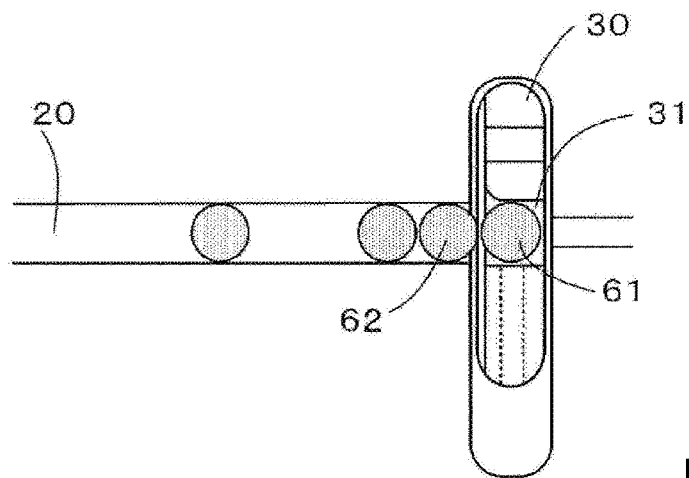
FIGS. 8A to 8C are diagrams for explaining an operation of the movable block of the article supplying device according to the first embodiment of the present invention.

In FIG. 8A, the movable block 30 is in the receiving position. The solder balls are conveyed by an air flow to reach the downstream end, and the leading solder ball 61 is received by the housing portion 31 of the movable block.

Figure 8B:
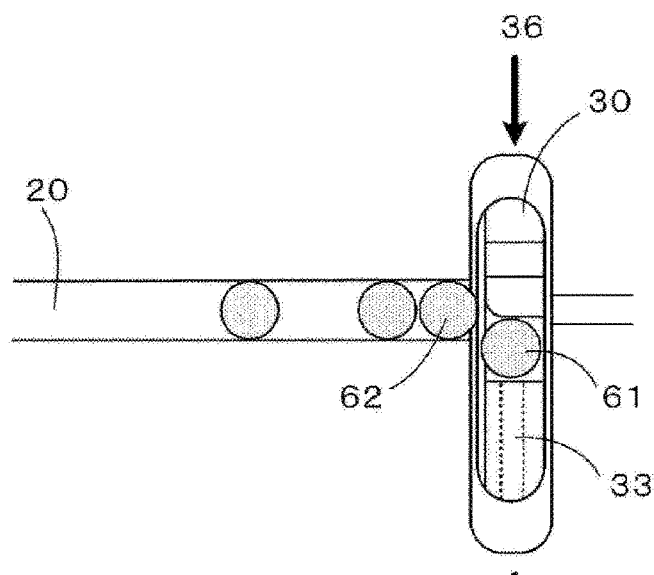

Next, in FIG. 8B, the movable block 30 moves toward the take-out position from the receiving position by sucking the air in the movable area (34 in FIG. 5) from the pressurization/depressurization portion (35 in FIG. 5 and FIG. 6) on the take-out port side and by sending air into the movable area from the pressurization/depressurization portion (36 in FIG. 5 and FIG. 6) on the conveyance path side. In this context, since the vent portion 33 for fixation is communicated with the pressurization/depressurization portion 35, the solder ball 61 in the housing portion is sucked to the opening (38 in FIG. 5 and FIG. 6) of the vent portion for fixation to be fixed (positioned) to the bottom face of the housing portion.

Figure 8C:
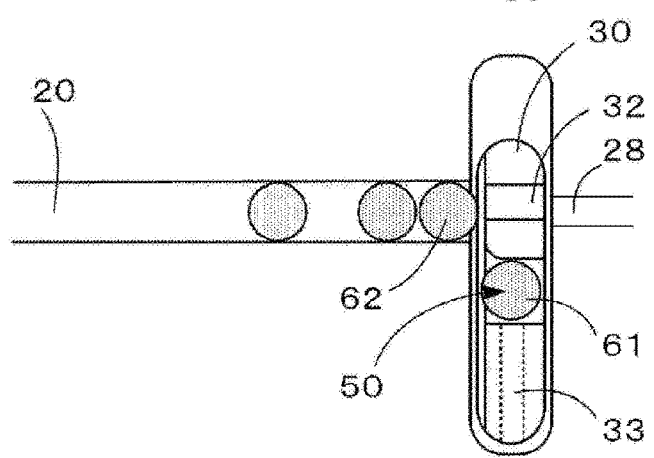

Then, in FIG. 8C, the movable block 30 reaches the take-out position. The solder ball 61 is being sucked to the opening of the vent portion for fixation. The shatter (51 in FIG. 5) on the upper portion of the take-out port 50 is opened and the solder ball 61 is taken out by the pickup nozzle. On the other hand, the conveyance path 20 is communicated with the air suction portion 28 via the vent portion 32 for conveyance, so that the solder balls on the conveyance path continue to move toward the downstream, and the subsequent solder balls 62 are dammed by the movable block to form a line.

Then, in contrast to FIG. 8B, the movable block 30 returns to the receiving position (FIG. 8A) from the take-out position by sucking the air in the movable area from the pressurization/depressurization portion (36 in FIG. 5 and FIG. 6) on the conveyance path side and by sending air into the movable area from the pressurization/depressurization portion (35 in FIG. 5 and FIG. 6) on the take-out port side.

Repeating the above operation to sequentially separate only the leading one solder ball (one by one) from the line of the solder balls that have reached the downstream end of the conveyance path makes it possible to supply the solder balls to the pickup nozzle one by one.

Next, an action of the biting preventing portion of this embodiment will be described.

As described in FIGS. 7A to 7C, even if the solder ball smaller than the standard radius is housed in the housing portion, a hindrance to movement of the movable block by the subsequent solder ball can be prevented by appropriately setting a size of the housing portion (a distance A in FIG. 7A). However, if the solder ball drastically smaller than the standard radius enters or if the two solder balls each smaller than the standard radius are consecutively conveyed or the like, the subsequent solder ball can interfere with the movement of the movable block to the take-out position.

FIGS. 9A and 9B illustrate that, if there is no biting preventing portion, when the two solder balls each smaller than the standard radius are conveyed consecutively, biting could occur in some cases. In FIG. 9A, approximately one third of the subsequent solder ball 62 has entered into the housing portion. If the movable block 30 is to be moved to the take-out position in this state, as illustrated in FIG. 9B, the subsequent solder ball 62 is bitten between the side wall 91 of the housing portion 31 on the receiving position side and the side wall 94 on the conveyance path downstream end on the take-out position side, whereby the operation of the movable block 30 is stopped. At this time, the subsequent solder ball 62 is in point contact with the corner on the conveyance path side of the side wall 91 located on the receiving position side of the housing portion 31 at a point P1 in FIG. 9B, and a force is working to a lower direction in FIGS. 9A and 9B in a form pushed by the movable block 30.

Next, FIGS. 10A and 10B illustrate an operation of this embodiment in which the biting preventing portion 90 is provided. FIG. 10A illustrates a state where approximately one third of the subsequent solder ball 62 has entered into the housing portion 31 due to the conveyance of two consecutive solder balls each smaller than the standard radius similarly to the case in FIGS. 9A and 9B. On the movable block 30, as illustrated in FIG. 13, the biting preventing portion 90 is provided on the corner 93 on the conveyance path 20 side on the side wall 91 located on the receiving position side of the housing portion 31.

Next, in FIG. 10B, the movable block 30 is moved toward the take-out position (the lower direction in FIGS. 10A and 10B). At this time, the subsequent solder ball 62 is brought into contact with the rounded surface portion that is the biting preventing portion 90, and the force having a pushing-back action to the solder ball 62 toward the conveyance path 20 (force in a diagonally lower left direction in FIGS. 10A and 10B) acts. As a result, the subsequent solder ball 62 is pushed back toward the conveyance path 20.

Hereinafter, effects of the embodiment will be described.

In the article supplying device of the embodiment, as illustrated in FIG. 8A to 8C, the leading one solder ball 61 among solder balls forming a line at the downstream end of the conveyance path is separated and moved to the take-out port by the movable block, preventing the leading one solder ball 61 from interfering with the subsequent solder ball 62 upon taking out the leading one solder ball 61. This makes it difficult to cause failures even when taking out pitch is made short, and makes it possible to increase the number of solder balls to be supplied per unit time.

Moreover, since the subsequent solder ball having entered into the housing portion is pushed back to the conveyance path by the action of the biting preventing portion 90, and the solder ball is not bitten between the movable block and the end portion of the conveyance portion when the movable block is moved. This is particularly advantageous for conveyed objects with large variation in size. Moreover, it is less likely that such problem occurs in a highly accurate component with small variation in size, but even if an abnormal situation where solder balls smaller than the standard consecutively come in occurs, there is an advantage that continuous supply is possible without stopping the operation of the device.

Furthermore, since the biting preventing portion 90 is brought into surface contact with the subsequent solder ball, it has an effect that damage on the conveyed object by the contact with the movable block is reduced.

Next, a second embodiment of the article supplying device of the present invention will be described on the basis of FIG. 11. This embodiment is different from the first embodiment in a point that the chamfered shape is a corner surface.

Figure 14:
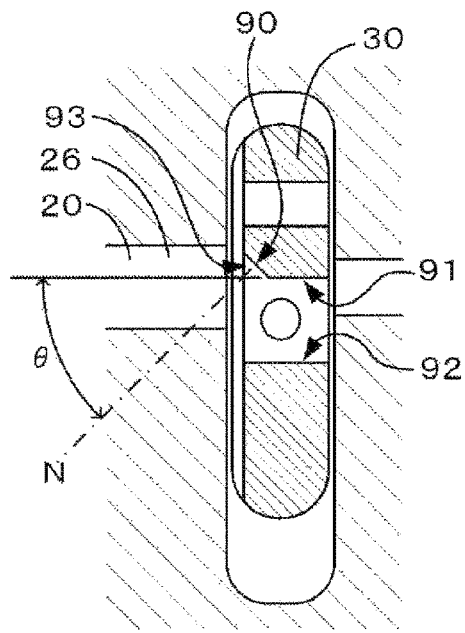
FIG. 14 is an enlarged plan view of the movable block of the article supplying device which is the second embodiment of the present invention.

As illustrated in FIG. 14, in this embodiment, the corner 93 on the conveyance path 20 side (conveyance path downstream end 26 side) of the side wall 91 on the receiving position side of the housing portion 31 is chamfered to a cutaway plane shape and forms the biting preventing portion 90. Here, the corner is cut off by obliquely cutting it. If a chamfered angle θ (an angle formed by a normal N of the corner surface and the side-wall surface 91) is too large, the action of pushing back the solder ball to the conveyance path becomes smaller. Therefore, the chamfered angle θ is preferably 70 degrees or less, more preferably 50 degrees or less or particularly preferably 45 degrees or less. Moreover, if the chamfered angle θ is too small, an edge portion between the corner surface and the side-wall surface and the subsequent solder ball 62 are brought into point contact, and the solder ball could be damaged easily. Thus, the chamfered angle θ is preferably 20 degrees or more or more preferably 40 degrees or more.

Figure 11:
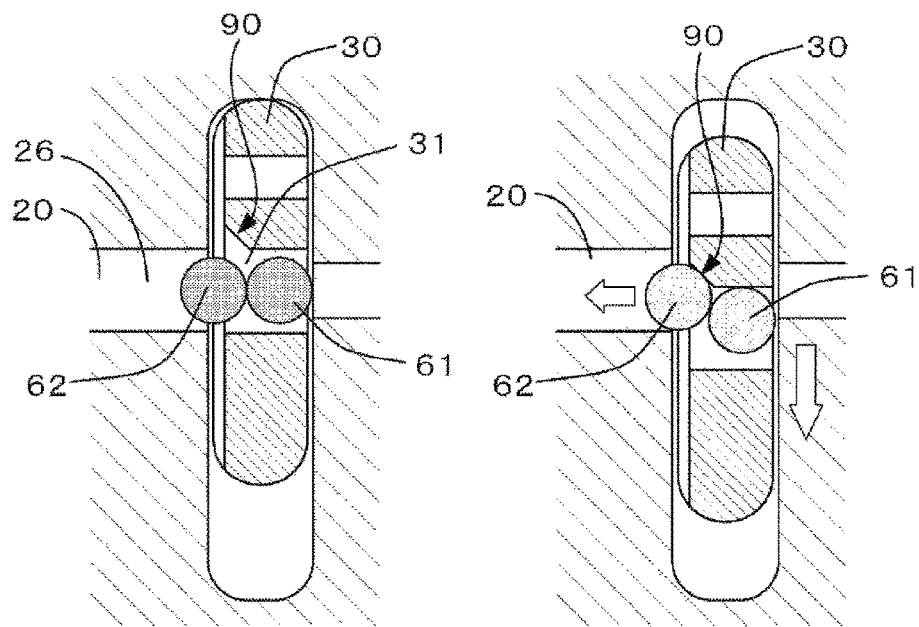
FIG. 11 is a view for explaining the operation of the biting preventing portion of the article supplying device which is a second embodiment of the present invention.

In FIG. 11, even if substantially one third of the subsequent solder ball 62 enters into the housing portion 31 due to the continuous conveyance of the two solder balls smaller than the standard radius, the subsequent solder ball 62 and the corner surface portion that is the biting preventing portion 90 are brought into contact along with movement to the take-out position (in the lower direction in FIG. 11) of the movable block 30, and the force (force in the diagonally lower left direction in FIG. 11) having the action of pushing back the solder ball 62 toward the conveyance path 20 direction acts. As a result, the subsequent solder ball 62 is pushed back toward the conveyance path 20 direction.

Next, a third embodiment of an article supplying device of the present invention will be described on the basis of FIG. 12.

Figure 12:
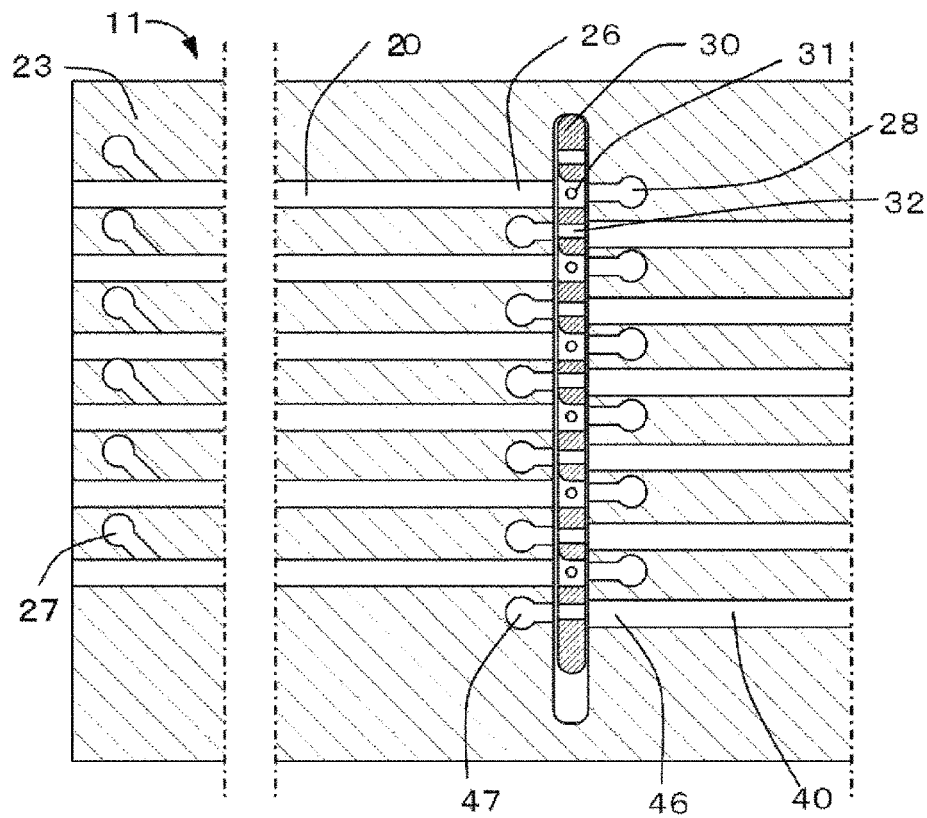
FIG. 12 is a horizontal sectional view along a conveyance path of the article supplying device which is a third embodiment of the present invention.

In FIG. 12, an article supplying device 11 of the embodiment is provided with a plurality of first conveyance paths 20 in parallel. The embodiment differs from the first embodiment in that no take-out ports exist above a movable block 30 and conveyed objects are further dispensed in respective second conveyance paths from the movable block.

Second conveyance paths 40 are provided in parallel by the same number and at the same intervals as those of the first conveyance paths on the side opposite to the first conveyance paths 20 with respect to the movable block 30. Furthermore, the second conveyance paths are staggered in the width direction of the first conveyance paths such that an extension to the upstream side of each of the second conveyance paths is located between corresponding two of the first conveyance paths.

The movable block 30 in the receiving position receives conveyed objects in housing portions 31 from downstream ends 26 of the first conveyance paths. Then, the movable block dispenses, at the other end of reciprocal movement, the conveyed objects in the housing portions to upstream ends 46 of the second conveyance paths. This state is called that the movable block or the housing portions is in a dispensing position. The conveyed objects are further conveyed to the downstream through the second conveyance paths.

The biting preventing portion is provided on each of the plurality of housing portions, and each biting preventing portion is a chamfered portion provided on the corner on the first conveyance path side of the side wall located on the receiving position side of each housing portion.

The structure and the function of the other portions are similar to those of the other portions in the first embodiment. Furthermore, the effect of separating conveyed objects from the leading one in each conveyance path by the movable block, the effect of fixing the conveyed object in each housing portion by a vent portion for fixation, and the effect of pushing back the subsequent conveyed object toward the first conveyance path by the biting preventing portion are same as those in the first embodiment.

According to the article supplying device 11 of the embodiment, the conveyed objects that have been conveyed through the first conveyance paths arranged in parallel are once housed in the movable block, and then concurrently introduced in the second conveyance paths. In this manner, the conveyed objects can be supplied to the next process with synchronization by the movable block.

The present invention is not limited to the above embodiments, and various modifications can be made within the scope of its technical idea.

For example, the conveyed objects are not limited to solder balls, and may be other articles such as minute bearing balls, and spacers for liquid crystal display panel. Furthermore, the shape of the conveyed objects is not limited to a spherical shape, and the article supplying devices according to the present invention can be suitably used for minute articles having the shape in which their lower surface is convex such as spheroids. Note that when the conveyed object is not spherical, the aforementioned distance A and gap G can be set to values preferable for the maximum radius R' of the conveyed object in parallel with the housing portion bottom face. Moreover, the conveyed object may have a substantially cuboid shape such as MLCC.

Moreover, the shape of the biting preventing portion is not limited to a round surface or a corner surface but only needs to be such that it can apply a force in a direction of pushing back the subsequent conveyed object entered into the housing portion to the conveyance path.

Figure 15:
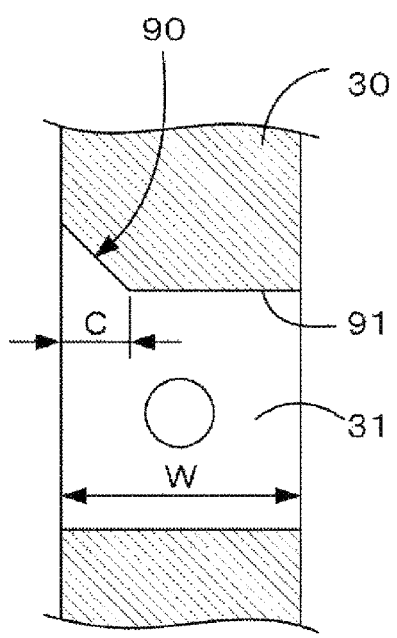
FIG. 15 is a view for explaining a chamfering dimension.

Moreover, the size of the chamfered shape of the biting preventing portion is not particularly limited but may be designed as appropriate on the basis of a size of the conveyed object and a size of the side-wall surface of the housing portion. With reference to FIG. 15, if a dimension C (hereinafter referred to as a "chamfered dimension") of one side on the housing portion side of the chamfered portion is increased, a plane portion of the side wall 91 is made smaller for that portion. If the plane portion of the side wall 91 becomes too small, the first conveyed object housed in the housing portion cannot be pushed stably to the take-out position side when the movable block is moved. Thus, the chamfered dimension C is preferably 40% or less of a width W of the housing portion in the receiving direction. Moreover, if the chamfered dimension is too small, the edge portion between the chamfered portion and the side-wall surface and the subsequent solder ball 62 are brought into point contact, and the solder ball could be damaged easily. Thus, the chamfered dimension C is preferably 20% or more of the width W of the housing portion in the receiving direction.

The invention claimed is:

1. An article supplying device having:
   a conveyance portion for conveying conveyed objects; and
   a movable block, wherein
   the movable block comprises following configurations (1)-(4):
      (1) the movable block has a housing portion capable of housing one of the conveyed objects in a receiving position in which the housing portion communicates with a downstream end of the conveyance portion;
      (2) the movable block is capable of a reciprocal movement in a direction intersecting a receiving direction of the conveyed objects; and
      (3) the housing portion is in the receiving position at one end of the reciprocal movement, and the housing portion is in a dispensing position or a take-out position in which the conveyed objects can be dispensed or taken out at an other end of the reciprocal movement (4) the movable block has a biting preventing portion for pushing back a subsequent conveyed object of the conveyed objects entered into the housing portion after a previous conveyed object of the conveyed objects having been housed in the housing portion toward the conveyance portion, wherein the biting preventing portion contacts the subsequent conveyed object along with movement of the reciprocal movement from the one end to the other end to push back the subsequent conveyed object to the conveyance portion, the biting preventing portion is a chamfered portion having a chamfered shape provided at a corner on a conveyance portion side of a side wall located on a receiving position side of the housing portion, the chamfered shape is a cutaway surface, and a chamfered angle θ is 70 degrees or less and 20 degrees or more.

2. The article supplying device according to claim 1, further having pressurization/depressurization portions at each end of a movable area of the movable block, wherein
the movable block is capable of the reciprocal movement by a pressure difference caused by the pressurization/depressurization portions.

3. The article supplying device according to claim 1, wherein
the movable block further has a positioning mechanism, and
the positioning mechanism is capable of positioning, within the housing portion, the conveyed objects housed in the housing portion.

4. An article supplying device having:
a conveyance portion for conveying conveyed objects; and
a movable block, wherein
the movable block comprises following configurations (1)-(4):
(1) the movable block has a housing portion capable of housing one of the conveyed objects in a receiving position in which the housing portion communicates with a downstream end of the conveyance portion;
(2) the movable block is capable of a reciprocal movement in a direction intersecting a receiving direction of the conveyed objects; and
(3) the housing portion is in the receiving position at one end of the reciprocal movement, and the housing portion is in a dispensing position or a take-out position in which the conveyed objects can be dispensed or taken out at an other end of the reciprocal movement
(4) the movable block has a biting preventing portion for pushing back a subsequent conveyed object of the conveyed objects entered into the housing portion after a previous conveyed object of the conveyed objects having been housed in the housing portion toward the conveyance portion, wherein the biting preventing portion contacts the subsequent conveyed object along with movement of the reciprocal movement from the one end to the other end to push back the subsequent conveyed object to the conveyance portion, the biting preventing portion is a chamfered portion having a chamfered shape provided at a corner on a conveyance portion side of a side wall located on a receiving position side of the housing portion, and the chamfered shape is a fillet surface.

5. The article supplying device according to claim 4, further having pressurization/depressurization portions at each end of a movable area of the movable block, wherein
the movable block is capable of the reciprocal movement by a pressure difference caused by the pressurization/depressurization portions.

6. The article supplying device according to claim 4, wherein
the movable block further has a positioning mechanism, and
the positioning mechanism is capable of positioning, within the housing portion, the conveyed objects housed in the housing portion.

* * * * *